United States Patent
Milheim et al.

(10) Patent No.: US 11,751,330 B2
(45) Date of Patent: Sep. 5, 2023

(54) MAGNETIC MATERIAL FILLED PRINTED CIRCUIT BOARDS AND PRINTED CIRCUIT BOARD STATORS

(71) Applicant: E-Circuit Motors, Inc., Newton, MA (US)

(72) Inventors: George Harder Milheim, Bozeman, MT (US); Steven Robert Shaw, Bozeman, MT (US); Ryan Terrence Duffy, Lowell, MA (US); Edward Charles Carignan, Goffstown, NH (US)

(73) Assignee: E-Circuit Motors, Inc., Needham Heights, MA (US)

( * ) Notice: Subject to any disclaimer, the term of this patent is extended or adjusted under 35 U.S.C. 154(b) by 0 days.

(21) Appl. No.: 17/874,369

(22) Filed: Jul. 27, 2022

(65) Prior Publication Data
US 2023/0036536 A1    Feb. 2, 2023

Related U.S. Application Data

(60) Provisional application No. 63/227,644, filed on Jul. 30, 2021.

(51) Int. Cl.
*H05K 1/03*   (2006.01)
*H05K 1/16*   (2006.01)
*H05K 3/10*   (2006.01)

(52) U.S. Cl.
CPC ........... *H05K 1/0373* (2013.01); *H05K 1/165* (2013.01); *H05K 3/10* (2013.01); *H05K 2201/0137* (2013.01); *H05K 2201/086* (2013.01)

(58) Field of Classification Search
CPC ........ H05K 1/165; H05K 3/10; H05K 1/0373; H05K 2201/0137; H05K 2201/086
See application file for complete search history.

(56) References Cited

U.S. PATENT DOCUMENTS

| | | | | |
|---|---|---|---|---|
| 2,970,238 A | * | 1/1961 | Swiggett | H02K 3/26 336/200 |
| 3,096,455 A | * | 7/1963 | Hahn | H02K 23/54 310/233 |

(Continued)

FOREIGN PATENT DOCUMENTS

| | | |
|---|---|---|
| CN | 201204540 Y | 3/2009 |
| CN | 103001426 A | 3/2013 |

(Continued)

OTHER PUBLICATIONS

Invitation to Pay Additional Fees and, Where Applicable, Protest Fee issued Jan. 5, 2023 for International Patent Application No. PCT/US2022/038433.

*Primary Examiner* — William H. Mayo, III
*Assistant Examiner* — Rhadames Alonzo Miller
(74) *Attorney, Agent, or Firm* — PIERCE ATWOOD LLP

(57) ABSTRACT

A dielectric substrate may support conductive traces that form windings for a least one pole of a planar armature of an axial flux machine. At least a portion of the dielectric substrate, which is adapted to be positioned within an annular active area of the axial flux machine, may include a soft magnetic material. Such a planar armature may be produced, for example, by forming the conductive traces on the dielectric substrate, and filling interstitial gaps between the conductive traces with at least one epoxy material in which the soft magnetic material is embedded.

15 Claims, 7 Drawing Sheets

(56) References Cited

U.S. PATENT DOCUMENTS

| | | | |
|---|---|---|---|
| 3,944,857 A | 3/1976 | Faulhaber | |
| 4,045,696 A | 8/1977 | Lutz et al. | |
| 4,115,915 A * | 9/1978 | Godfrey | H02K 3/505 310/71 |
| 4,658,162 A * | 4/1987 | Koyama | H02K 29/08 318/135 |
| 4,677,332 A | 6/1987 | Heyraud | |
| 4,733,115 A * | 3/1988 | Barone | H02K 29/08 361/783 |
| 4,804,574 A * | 2/1989 | Osawa | H02K 5/225 428/209 |
| 5,097,140 A | 3/1992 | Crall | |
| 5,099,162 A * | 3/1992 | Sawada | H02K 3/26 505/211 |
| 5,126,613 A | 6/1992 | Choi | |
| 5,332,460 A | 7/1994 | Hosoya | |
| 5,592,037 A | 1/1997 | Sickafus | |
| 5,616,977 A * | 4/1997 | Hill | H02K 7/14 310/260 |
| 5,644,183 A * | 7/1997 | Van Loenen | H02K 21/24 310/DIG. 6 |
| 5,646,465 A * | 7/1997 | Paweletz | D01H 4/14 57/58.3 |
| 5,710,476 A | 1/1998 | Ampela | |
| 5,773,905 A | 6/1998 | Hill | |
| 5,952,742 A | 9/1999 | Stoiber et al. | |
| 6,194,806 B1 * | 2/2001 | Suzuki | H02K 1/148 310/194 |
| 6,294,477 B1 * | 9/2001 | Ho | H01L 21/76801 257/E21.582 |
| 6,350,633 B1 * | 2/2002 | Lin | H01L 24/11 257/E23.021 |
| 6,562,657 B1 * | 5/2003 | Lin | H01L 23/4985 438/618 |
| 6,562,709 B1 * | 5/2003 | Lin | H01L 24/12 438/618 |
| 6,628,038 B1 * | 9/2003 | Shikayama | G01D 5/2086 310/DIG. 6 |
| 6,660,626 B1 * | 12/2003 | Lin | H01L 24/80 438/618 |
| 7,109,625 B1 * | 9/2006 | Jore | H02K 1/2793 310/198 |
| 7,112,910 B2 | 9/2006 | Lopatinsky et al. | |
| 7,301,428 B2 | 11/2007 | Suzuki et al. | |
| 7,415,756 B2 * | 8/2008 | Ishida | F04B 39/14 29/598 |
| 7,489,433 B2 * | 2/2009 | Urey | H02K 33/08 359/280 |
| 7,523,540 B2 | 4/2009 | Morel | |
| 7,582,999 B2 * | 9/2009 | Atkinson | H02K 3/50 310/179 |
| 7,750,522 B2 | 7/2010 | Gizaw et al. | |
| 7,763,997 B2 | 7/2010 | Dubuc et al. | |
| 7,812,697 B2 | 10/2010 | Fullerton et al. | |
| 7,882,613 B2 | 2/2011 | Barthelmie et al. | |
| 7,888,904 B2 | 2/2011 | Mularcik | |
| 8,058,762 B2 | 11/2011 | Asano | |
| 8,179,002 B2 | 5/2012 | Mancuso et al. | |
| 8,225,497 B2 | 7/2012 | Johnson et al. | |
| 8,339,019 B1 | 12/2012 | Oyague | |
| 8,362,731 B2 | 1/2013 | Smith et al. | |
| 8,397,369 B2 | 3/2013 | Smith et al. | |
| 8,400,038 B2 | 3/2013 | Smith et al. | |
| 8,558,425 B2 | 10/2013 | Stahlhut et al. | |
| 8,598,761 B2 | 12/2013 | Langford et al. | |
| 8,692,637 B2 | 4/2014 | Richards et al. | |
| 8,716,913 B2 | 5/2014 | Kvam et al. | |
| 8,723,052 B1 * | 5/2014 | Sullivan | H05K 1/0201 174/262 |
| 8,723,402 B2 | 5/2014 | Oyague | |
| 8,736,133 B1 | 5/2014 | Smith et al. | |
| 8,785,784 B1 * | 7/2014 | Duford | H05K 1/165 174/262 |
| 8,816,543 B2 | 8/2014 | Kozar et al. | |
| 8,823,241 B2 | 9/2014 | Jore et al. | |
| 8,941,961 B2 | 1/2015 | Banerjee et al. | |
| 9,013,257 B2 | 4/2015 | Steingroever | |
| 9,030,071 B2 | 5/2015 | Bradley et al. | |
| 9,154,024 B2 | 10/2015 | Jore et al. | |
| 9,269,483 B2 | 2/2016 | Smith et al. | |
| 9,479,038 B2 | 10/2016 | Smith et al. | |
| 9,673,684 B2 | 6/2017 | Shaw | |
| 9,673,688 B2 * | 6/2017 | Shaw | H02K 15/03 |
| 9,762,099 B2 | 9/2017 | Jore et al. | |
| 9,800,109 B2 | 10/2017 | Shaw | |
| 9,859,763 B2 | 1/2018 | Shaw | |
| 10,135,310 B2 | 11/2018 | Schuler et al. | |
| 10,170,953 B2 | 1/2019 | Shaw | |
| 10,211,694 B1 | 2/2019 | Shaw | |
| 10,256,690 B2 | 4/2019 | Shaw | |
| 10,819,174 B2 | 10/2020 | Schuler et al. | |
| 11,005,322 B2 | 5/2021 | Milheim et al. | |
| 11,121,614 B2 | 9/2021 | Milheim | |
| 2002/0145360 A1 | 10/2002 | Pullen | |
| 2002/0153786 A1 * | 10/2002 | Iwai | H02K 29/14 310/67 R |
| 2004/0209395 A1 * | 10/2004 | Yang | H05K 3/243 438/106 |
| 2005/0030140 A1 * | 2/2005 | Dahlgren | H01F 27/255 336/5 |
| 2005/0067905 A1 | 3/2005 | Maney et al. | |
| 2005/0104692 A1 * | 5/2005 | Lee | H05K 1/0253 333/246 |
| 2005/0194855 A1 * | 9/2005 | Hasebe | H02K 1/2793 310/156.43 |
| 2006/0012263 A1 * | 1/2006 | Smith | H02K 1/182 310/268 |
| 2006/0049516 A1 * | 3/2006 | Wang | H05K 1/111 257/E23.068 |
| 2006/0055265 A1 * | 3/2006 | Zalusky | H02K 21/24 310/40 MM |
| 2006/0188416 A1 * | 8/2006 | Alward | B01D 39/2086 422/180 |
| 2006/0202584 A1 * | 9/2006 | Jore | H02K 21/24 310/179 |
| 2007/0173052 A1 * | 7/2007 | Ma | H05K 3/243 29/829 |
| 2007/0216247 A1 | 9/2007 | Lee | |
| 2007/0247014 A1 | 10/2007 | Schach et al. | |
| 2007/0273218 A1 * | 11/2007 | Atkinson | H02K 3/50 310/201 |
| 2008/0067874 A1 | 3/2008 | Tseng | |
| 2008/0100166 A1 * | 5/2008 | Stahlhut | H02K 1/20 310/156.32 |
| 2008/0100174 A1 * | 5/2008 | Stahlhut | H02K 1/20 310/156.32 |
| 2009/0021333 A1 | 1/2009 | Fiedler | |
| 2009/0072640 A1 | 3/2009 | Tanaka | |
| 2009/0072651 A1 | 3/2009 | Yan et al. | |
| 2010/0000112 A1 | 1/2010 | Carow et al. | |
| 2010/0123372 A1 | 5/2010 | Huang et al. | |
| 2010/0289348 A1 * | 11/2010 | Gruendl | H02K 9/227 310/257 |
| 2010/0314963 A1 * | 12/2010 | Gruendl | H02K 21/227 310/191 |
| 2011/0024146 A1 | 2/2011 | Katou et al. | |
| 2011/0241460 A1 | 10/2011 | Mebarki et al. | |
| 2011/0241470 A1 | 10/2011 | Takeuchi | |
| 2011/0273048 A1 | 11/2011 | Jore et al. | |
| 2012/0033236 A1 | 2/2012 | Tsugimura | |
| 2012/0041062 A1 | 2/2012 | Zhou et al. | |
| 2012/0212080 A1 | 8/2012 | Jiang et al. | |
| 2012/0217831 A1 | 8/2012 | Jore et al. | |
| 2012/0262019 A1 | 10/2012 | Smith et al. | |
| 2012/0262020 A1 * | 10/2012 | Smith | H02K 21/12 29/596 |
| 2013/0049500 A1 * | 2/2013 | Shan | H02K 3/26 310/71 |
| 2013/0052491 A1 | 2/2013 | Bull et al. | |
| 2013/0053942 A1 | 2/2013 | Kamel et al. | |
| 2013/0062984 A1 | 3/2013 | Tremelling | |

(56) References Cited

U.S. PATENT DOCUMENTS

| | | | |
|---|---|---|---|
| 2013/0069467 A1* | 3/2013 | Smith | H02K 3/522 310/156.08 |
| 2013/0072604 A1 | 3/2013 | Bowen, III et al. | |
| 2013/0076192 A1* | 3/2013 | Tanimoto | H02K 3/26 310/208 |
| 2013/0119802 A1 | 5/2013 | Smith et al. | |
| 2013/0214631 A1 | 8/2013 | Smith et al. | |
| 2013/0234566 A1 | 9/2013 | Huang et al. | |
| 2013/0270945 A1* | 10/2013 | Ziegler | H02K 1/2793 310/90 |
| 2013/0342054 A1 | 12/2013 | Long et al. | |
| 2014/0021968 A1 | 1/2014 | Lee | |
| 2014/0021969 A1 | 1/2014 | Tseng et al. | |
| 2014/0021972 A1 | 1/2014 | Barabi et al. | |
| 2014/0028149 A1 | 1/2014 | Oyague | |
| 2014/0035414 A1 | 2/2014 | Hsieh | |
| 2014/0042868 A1* | 2/2014 | Sullivan | H02K 1/28 29/598 |
| 2014/0152136 A1* | 6/2014 | Duford | H02K 1/278 310/156.08 |
| 2014/0175922 A1 | 6/2014 | Jore et al. | |
| 2014/0201291 A1 | 7/2014 | Russell | |
| 2014/0262499 A1 | 9/2014 | Smith et al. | |
| 2014/0265653 A1* | 9/2014 | Heins | H02K 1/143 310/198 |
| 2014/0268460 A1 | 9/2014 | Banerjee et al. | |
| 2014/0300223 A1 | 10/2014 | Yamada et al. | |
| 2014/0368079 A1 | 12/2014 | Wong et al. | |
| 2015/0084446 A1 | 3/2015 | Atar | |
| 2015/0188375 A1* | 7/2015 | Sullivan | H02K 3/26 310/71 |
| 2015/0188391 A1 | 7/2015 | Carron et al. | |
| 2015/0229173 A1* | 8/2015 | Sromin | H02K 1/32 310/208 |
| 2015/0244219 A1 | 8/2015 | Woolmer | |
| 2015/0311756 A1* | 10/2015 | Sullivan | H02K 1/2786 310/156.37 |
| 2015/0318751 A1* | 11/2015 | Smith | H02K 21/24 310/71 |
| 2015/0349609 A1 | 12/2015 | Tremelling et al. | |
| 2016/0069349 A1* | 3/2016 | Kreidler | H02K 5/18 29/888.024 |
| 2016/0069352 A1* | 3/2016 | Kreidler | F04D 29/263 29/598 |
| 2016/0072359 A1* | 3/2016 | Kreidler | F04D 25/06 29/598 |
| 2016/0247616 A1 | 8/2016 | Smith et al. | |
| 2016/0285327 A1 | 9/2016 | Sasaki et al. | |
| 2016/0285339 A1* | 9/2016 | Smith | F04D 25/06 |
| 2016/0372995 A1* | 12/2016 | Smith | H02K 21/12 |
| 2017/0040878 A1 | 2/2017 | Smith et al. | |
| 2017/0047792 A1* | 2/2017 | Klassen | H02K 1/20 |
| 2017/0098973 A1 | 4/2017 | Shaw | |
| 2017/0098985 A1* | 4/2017 | Shaw | H02K 15/03 |
| 2017/0323713 A1* | 11/2017 | Moeller | H02K 1/02 |
| 2018/0019646 A1* | 1/2018 | Quick | H02K 11/33 |
| 2018/0123412 A1 | 5/2018 | Karplus et al. | |
| 2018/0198338 A1 | 7/2018 | Schuler et al. | |
| 2019/0074745 A1 | 3/2019 | Morita et al. | |
| 2019/0149002 A1* | 5/2019 | Kim | H02K 11/215 417/423.8 |
| 2019/0273406 A1* | 9/2019 | Gehlert | H02K 5/08 |
| 2019/0305617 A1* | 10/2019 | Brahmavar | H02K 3/524 |
| 2019/0305655 A1* | 10/2019 | Brahmavar | H02K 21/24 |
| 2020/0044524 A1 | 2/2020 | van Ginkel | |
| 2020/0336031 A1* | 10/2020 | Takahashi | H02K 21/22 |
| 2021/0143691 A1 | 5/2021 | Lee et al. | |
| 2021/0203213 A1 | 7/2021 | Jore et al. | |
| 2022/0140680 A1* | 5/2022 | Coppola | H02K 21/14 310/61 |

FOREIGN PATENT DOCUMENTS

| | | |
|---|---|---|
| CN | 202856473 U | 4/2013 |
| CN | 103248182 A | 8/2013 |
| CN | 103580412 A | 2/2014 |
| CN | 104426263 A | 3/2015 |
| CN | 104467243 A | 3/2015 |
| CN | 105871089 A | 8/2016 |
| DE | 19954196 A1 | 6/2000 |
| DE | 102010062271 A1 | 6/2012 |
| DE | 102019131198 A1 | 12/2020 |
| DE | 112019003519 T5 | 6/2021 |
| EP | 3300126 A1 | 1/1989 |
| EP | 0563852 A1 | 10/1993 |
| EP | 1086523 A2 | 3/2001 |
| EP | 2139106 A1 | 12/2009 |
| EP | 2696481 A2 | 2/2014 |
| EP | 2882079 A2 | 6/2015 |
| EP | 3340436 A1 | 6/2018 |
| FR | 2262880 A1 | 9/1975 |
| GB | 2030790 A | 4/1980 |
| GB | 2466436 A | 6/2010 |
| GB | 2485185 A | 5/2012 |
| JP | 5836145 A | 3/1983 |
| JP | 59213287 A | 12/1984 |
| JP | 2001359251 A | 12/2001 |
| JP | 2008301666 A | 12/2008 |
| JP | 4639632 B2 | 2/2011 |
| WO | 2004/015843 A1 | 2/2004 |
| WO | 2004073365 A2 | 8/2004 |
| WO | 2009068079 A1 | 6/2009 |
| WO | 2016186533 A1 | 11/2016 |
| WO | 2020108505 A1 | 6/2020 |

* cited by examiner

MAGNETIC MATERIAL FILLED PRINTED CIRCUIT BOARDS AND PRINTED CIRCUIT BOARD STATORS

CROSS-REFERENCE TO RELATED APPLICATIONS

This application claims the benefit under 35 U.S.C. § 119(e) of U.S. Provisional Application No. 63/227,644, entitled MAGNETIC MATERIAL FILLED PRINTED CIRCUIT BOARDS AND PRINTED CIRCUIT BOARD STATORS, filed Jul. 30, 2021, the entire content of which is incorporated herein by reference.

BACKGROUND

Permanent magnet axial flux motors and generators described by several patents, such as U.S. Pat. No. 7,109,625 ("the '625 patent") and U.S. Pat. No. 10,170,953 ("the '953 patent"), the entire contents of which are incorporated herein by reference, feature a planar printed circuit board stator assembly between rotors.

SUMMARY

This Summary is provided to introduce a selection of concepts in a simplified form that are further described below in the Detailed Description. This Summary is not intended to identify key features or essential features, nor is it intended to limit the scope of the claims included herewith.

In accordance with one example embodiment, a planar armature for an axial flux machine comprises a dielectric substrate including at least a first portion that is adapted to be positioned within an annular active area of the axial flux machine, wherein at least the first portion comprises a soft magnetic material, and further comprises conductive traces supported by the dielectric substrate, the conductive traces forming windings for a least one pole of the planar armature.

In accordance with another example embodiment, a printed circuit board comprises a dielectric substrate, and conductive traces supported by the dielectric substrate, wherein at least a first portion of the dielectric substrate comprises a soft magnetic material.

In accordance with still another example embodiments, a method for forming a planar armature for an axial flux machine comprises forming conductive traces on a dielectric substrate, the conductive traces forming windings for a least one pole of the planar armature, and filling interstitial gaps between the conductive traces with at least one epoxy material in which soft magnetic material is embedded.

BRIEF DESCRIPTION OF THE DRAWINGS

Objects, aspects, features, and advantages of embodiments disclosed herein will become more fully apparent from the following detailed description, the appended claims, and the accompanying figures in which like reference numerals identify similar or identical elements. Reference numerals that are introduced in the specification in association with a figure may be repeated in one or more subsequent figures without additional description in the specification in order to provide context for other features, and not every element may be labeled in every figure. The drawings are not necessarily to scale, emphasis instead being placed upon illustrating embodiments, principles and concepts. The drawings are not intended to limit the scope of the claims included herewith.

DETAILED DESCRIPTION

Unlike machines of conventional construction, in which the armature is often wound using wire on a soft magnetic material core, the windings in a printed circuit board stator (e.g., as described in the '625 patent and the '953 patent incorporated by reference above) are supported by a non-magnetic composite material. This composite typically consists of a fiberglass cloth, epoxy, and copper for the winding and thermal structure. Accordingly, machines of this type are often described as "air core" machines.

The inventors have recognized and appreciated that such planar printed circuit board stators can be improved significantly by introducing one or more soft magnetic materials into the stator substrate. Several examples of planar circuit board stators enhanced with such soft magnetic material(s), as well as several example techniques for producing such stators, are described herein.

Figure 1:
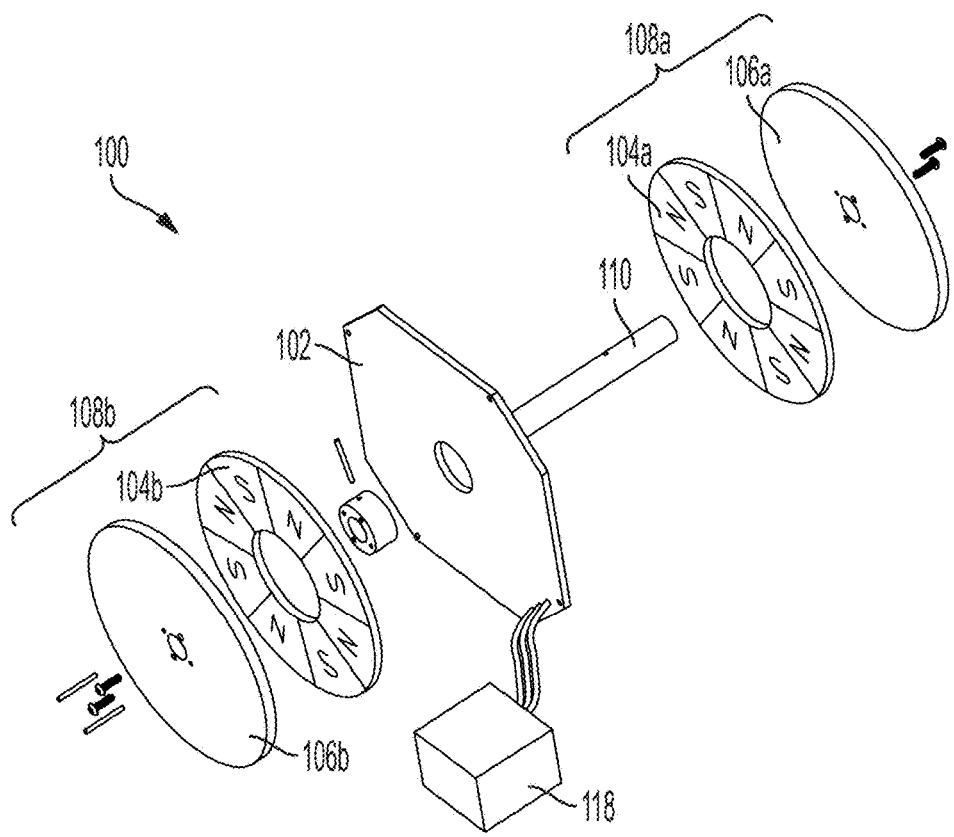
FIG. 1 shows an exploded view of internal components of an example axial flux machine with a planar stator.
Figure 2:
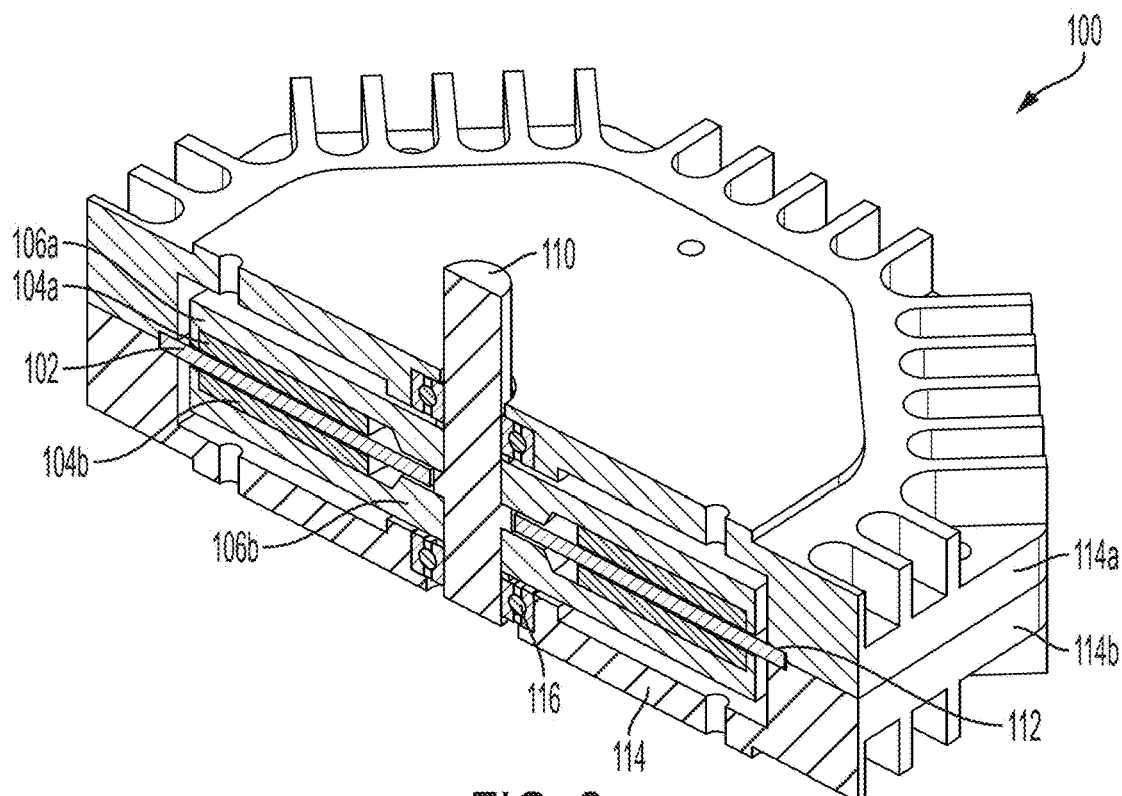
FIG. 2 shows a sectioned view of an axial flux machine including the components shown in FIG. 1.
Figure 3:
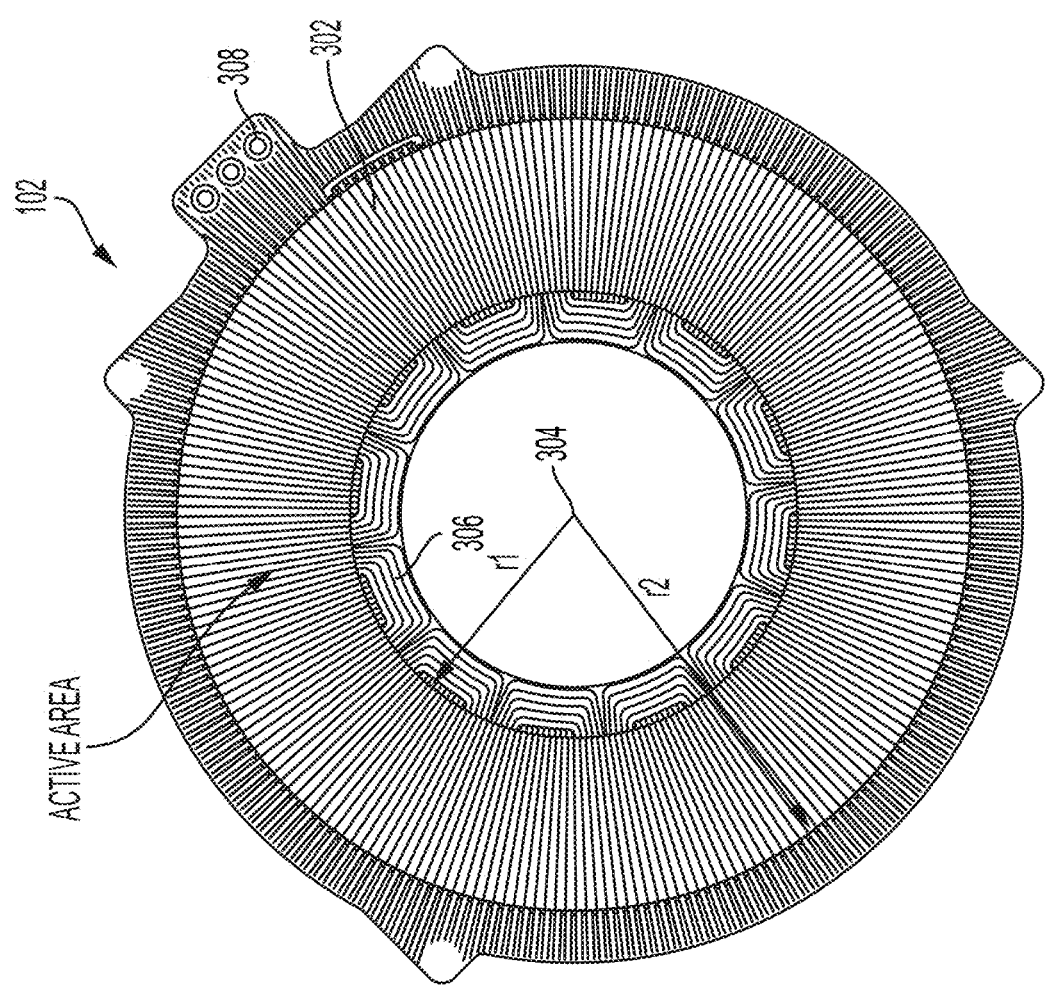
FIG. 3 shows an example planar stator that may be employed in an axial flux machine, such as the axial flux machine shown in FIGS. 1 and 2.

FIGS. 1 and 2 show exploded and sectioned views, respectively, of a planar stator axial flux machine 100 of the type disclosed in the '625 patent and the '953 patent. As shown in these figures, a planar stator 102 may be placed in the gap of a magnetic circuit established by components of a rotor. FIG. 3 shows a top view of an example planar stator 102 that may be employed in the machine 100. As shown best in FIG. 1, the rotor may include magnets 104a, 104b and support structures 106a, 106b that together form a pair of rotor assemblies 108a, 108b that may be attached to a shaft 110 of the rotor. As shown in FIG. 2, an outer edge 112 of the planar stator 102 may be fixedly secured to a housing 114 (e.g., by being held between respective sections 114a, 114b of the housing 114), whereas the rotor shaft 110 (to which the rotor assemblies 108a, 108b are attached) may be rotatable relative to the housing 114 (e.g., via bearings 116).

As shown in FIG. 3, the planar stator 102 may include radial traces 302. The portion of the planar stator 102 with such radial features, i.e., the annular region extending between a radial distance r1 (measured from a center point 304 of the planar stator 102, which coincides with the axis of rotation of the rotor of the machine 100) and a radial distance r2 (also measured from the center point 304), is located within the "active" area of the machine 100, in the sense that it is primarily responsible for the production of torque in the machine 100. The inner and outer radii of the magnets 104 attached to the rotor of the machine 100 are typically positioned at or near the radial distance r1 (measured from stator's axis of rotation) and the radial distance r2 (also measured from the stator's axis of rotation), respectively, thus creating axially directed magnetic flux within the annular active area. The remaining features, e.g., inner end turns 306 and outer end turns (which may be on a different layer of the planar stator 102) radially adjacent to the annular active area of the planar stator 102, may exist only to connect the radial traces 302 in series and parallel combinations and convey the associated currents and voltages to terminals 308 of the planar stator 102.

In motor mode, a current density that rotates synchronously about the rotor's axis of rotation may be imposed on the planar stator 102 by a controller 118 (shown in FIG. 1). The interaction of this current density with the magnetic flux in the gap from the rotor assemblies 108a, 108b leads to a torque of electromagnetic origin. The controller 118 may be operated such that the energy conversion effected by this structure is bidirectional, in the sense that the electric machine may absorb power from the mechanical terminals and deliver it to the electrical terminals, or it may deliver power to the mechanical terminals. Under appropriate control, a machine of this kind may simulate a variety of mechanical loads including components of friction, moment of inertia, and similar.

Figure 4:
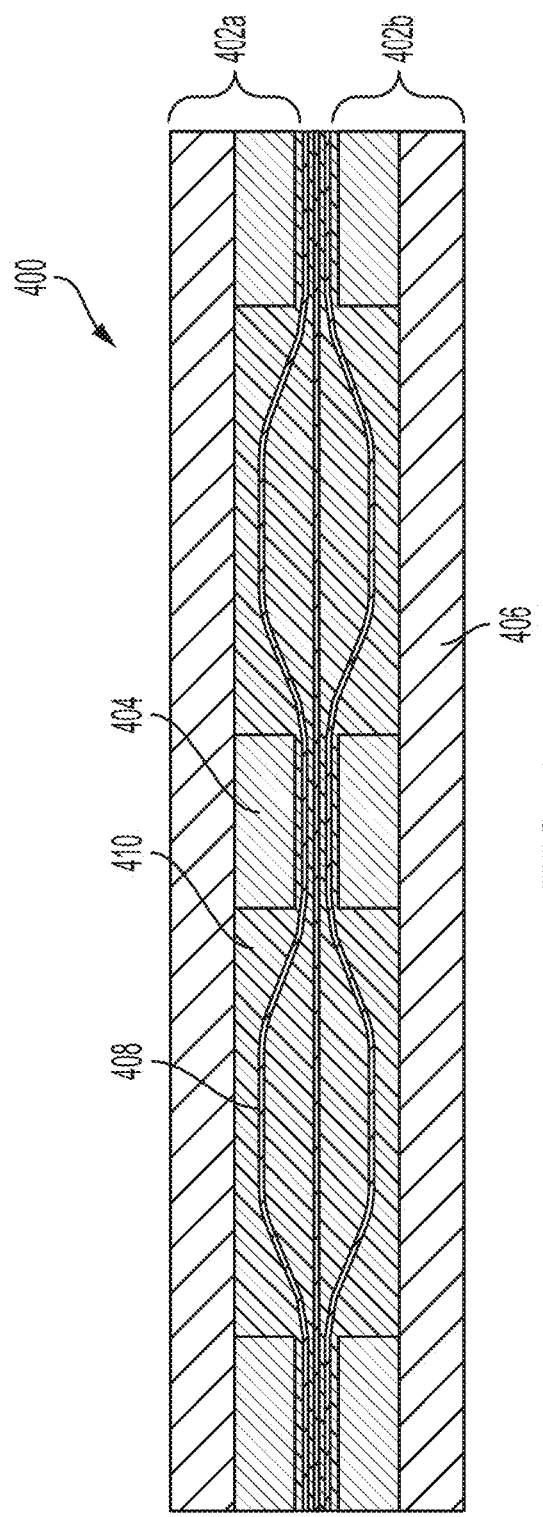
FIG. 4 shows a schematic view of the disposition of materials in a composite structure for a conventional printed circuit board.

FIG. 4 shows a schematic view of the disposition of materials in a composite structure 400 for a conventional printed circuit board with relatively high-profile traces. Such a structure may be used, for example, to form a conventional planar stator for an axial flux machine, such as the planar stator 102 of the axial flux machine 100 shown in FIGS. 1-3. The stack-up indicated in FIG. 4 focusses on the interface between two layers 402a, 402b of copper-clad material (e.g., a pre-fabricated glass-epoxy, copper sheet) and the opposing copper features 404 etched on the two copper-clad layers. In some implementations, for example, each of the layers 402 may be formed by etching a respective copper clad laminate (CCL) sheet, such as FR-4 CCL, to form the copper features 404. As illustrated, each layer 402 may include a dielectric core layer 406 (e.g., a fiberglass cloth) to which an etched copper sheet (including the copper features 404) is adhered (e.g., via an epoxy resin). Although not shown in FIG. 4, it should be appreciated that the opposite sides of the illustrated dielectric core layers 406 may likewise have copper sheets (possibly etched to form additional copper features 404) adhered to them. Etched CCL sheets of this type may be used, for example, to form the composite printed circuit board structures 500, 700 described below in connection with FIGS. 5 and 7. The copper features 404 may, for example, correspond to radial traces 302 within an "active area" of the planar stator 102 that extends between a first radius r1 and a second radius r2, as illustrated in FIG. 3.

As shown in FIG. 4, to bond the respective layers 402a, 402b together, achieve a flat composite structure 400, and provide dielectric between the opposing copper features 404, several layers of "prepreg" 408 may be inserted between the etched copper surfaces. "Prepreg" is an epoxy impregnated glass fiber cloth. As illustrated, epoxy 410 from the prepreg 408 may flow out of the high-profile contact areas into the interstitial space between the active-area traces. Sufficient prepreg may be employed so that the interstitial space can be filled when the composite structure 400 is compressed and bonded together.

Figure 5:
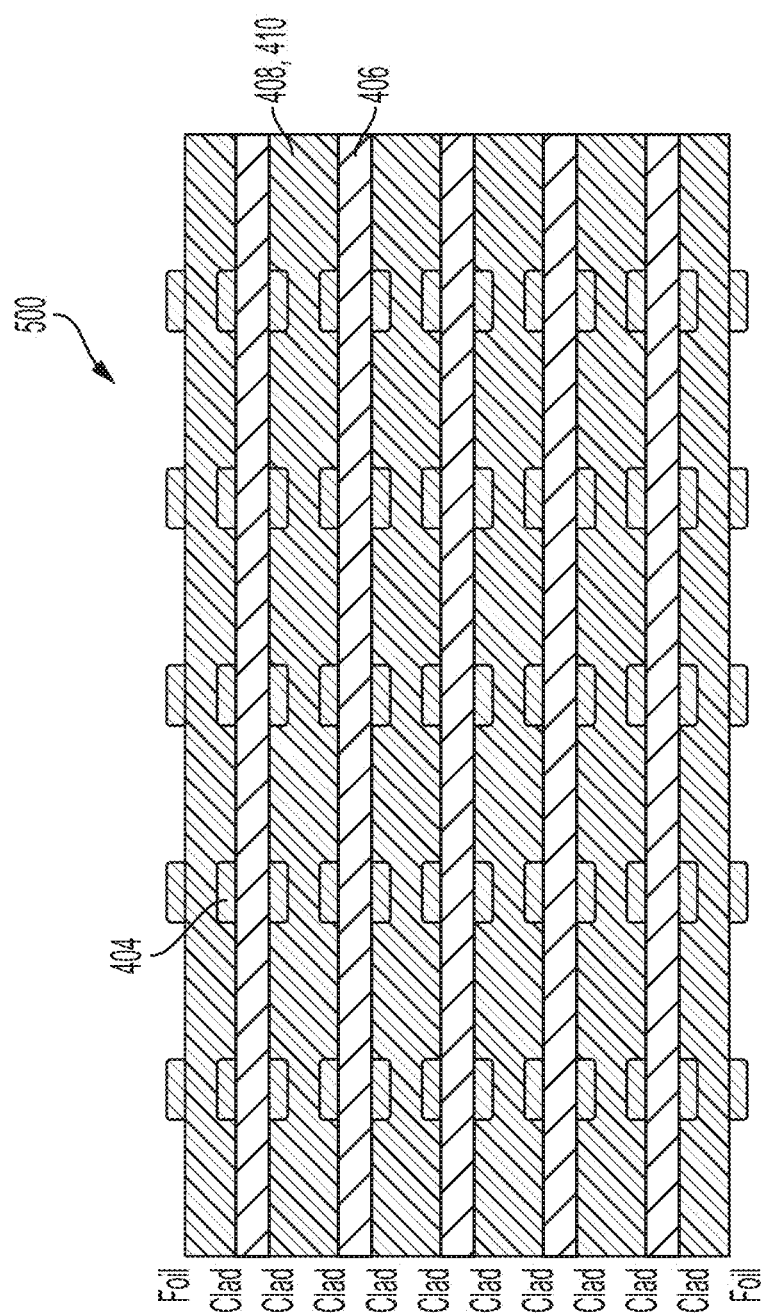
FIG. 5 shows a schematic view of how several of copies of the composite structure shown in FIG. 4 may be repeated in the stack-up of a conventional composite printed circuit board.

FIG. 5 shows a schematic view of how several of copies of the composite structure 400 shown in FIG. 4 may be included in the stack-up of a typical composite printed board structure 500 with, in this example, twelve layers of conductive materials including, e.g., copper features 404.

In simplest terms, in a machine of the type shown in FIGS. 1 and 2, the rotor supports a magnetic circuit in a rotating frame with a gap. The planar stator 102 is positioned within the gap, and windings on the planar stator 102 link flux from the rotor. Under quiescent conditions, the solution for the flux in the gap is essentially independent of the presence of the planar stator 102 because the materials used in the stator construction (e.g., the dielectric core layer 406, the prepreg 408, and the epoxy 410 shown in FIGS. 4 and 5) have a magnetic permeability that is essentially the same as free space, or "air." Machines of more conventional construction integrate the windings with soft magnetic material, often made from laminations of special steels. This material participates in the magnetic circuit. However, when soft magnetic structures are integrated with the stator in a permanent magnet brushless machine, for example, the steel is subjected to significant time-varying magnetic flux that tends to drive a variety of loss mechanisms in the soft magnetic material. This is one of the reasons that the materials used in such machines are typically made of laminated stampings that reduce the losses associated with eddy currents in the magnetic material. There are a number of disadvantages that come with the incorporation of soft magnetic materials in a typical steel lamination construction, including tooling costs, winding limitations (fill factor), electrical and acoustic noise, electrical insulation requirements, quality of motion, and thermal concerns.

An advantage is that the utilization of a core can reduce, or in some cases eliminate, the need for economically sensitive rare earth hard magnetic materials. Additionally, and independent of the hard magnetic materials, incorporating a core may improve some aspects of performance in a tradeoff with others. Consider, for purposes of illustration, a lossless machine with a transformation of electrical variables to the rotating frame—an ideally commutated machine. In this situation, the machine is characterized by a single constant that relates torque to current ($K_t$) and voltage, or back EMF, to speed ($K_v$). In appropriate units and quantities, these constants are equal. If the constant is made larger, a smaller current will provide a given torque, and a lower speed will result in a given terminal voltage.

The back EMF of the machine, and the constant which relates the machine current to torque, can be deduced by the flux linked by the turns. In particular, as a consequence of Maxwell's equations in the magnetoquasistatic case, turns linking a flux λ contribute a voltage $$v_t = \frac{d}{dt}\lambda$$

Further, if the flux linked by the static geometry of the turns (in the stator) is changed by virtue of the orientation of the rotor at angle θ with respect to the stator, then the equation above becomes $$v_t(\theta) = \frac{d\lambda}{d\theta}\frac{d\theta}{dt}.$$

The term $$\frac{d\lambda}{d\theta}$$

has two components to consider in a permanent magnet machine. One source of flux $\lambda_1$ contributing to $$\frac{d\lambda}{d\theta}$$

originates with the magnets fixed in the rotor ($\theta$ being the angle of the rotor) and the solution of the associated magnetic circuit. This is the term most important in the air-core machine. Another component $\lambda_2$ contributing to $$\frac{d\lambda}{d\theta}$$

involves the change of flux linked from the turns themselves. For this component, $\lambda_2 = L(\theta)$, which may be thought of as angle-dependent inductance.

At a fixed speed, $$\frac{d\theta}{dt} = \omega,$$

and steady-state conditions, the significance of $$\frac{d\lambda}{d\theta}$$

is that it provides a relationship between speed and voltage that determines the performance characteristics of the electric machine. This can be analyzed piece-by-piece, e.g., the voltage of the winding is the superposition of the $$\frac{d\lambda}{d\theta}$$

$\omega$ contributions of the components of the winding.

As $$\frac{d\lambda}{d\theta}$$

is a function of $\theta$, and is thus periodic, it has a Fourier series. In some cases, $$\frac{d\lambda}{d\theta}$$

terms may be well approximated by the first term of the series. In this case, the terminal voltage for a machine that has n poles and mechanically rotates at a frequency $\omega$ can be written, $$v(t) \approx K \sin(n\omega t + \theta_0)\omega.$$

In this equation, $\omega$ is the mechanical frequency of rotation, n is the pole count of the machine, $n\omega$ is the electrical frequency, t is time, $\theta_0$ is an angular offset, and $K \sin(n\omega t + \theta_0)$ is the first term of the Fourier series approximating $$\frac{d\lambda}{d\theta}$$

over the winding. Commutation of the machine effectively removes the sinusoidal dependency, and exposes K—with contributions from hard magnetic materials, the solution for the linked flux, and the $\theta$ dependent inductance terms—as the factor that can cause the machine to produce more voltage per unit speed, and more torque per amp. Addition of a soft magnetic core material to an air-core machine can increase the components contributing to $$\frac{d\lambda}{d\theta},$$

and thus generally increase K for the machine.

One possible way to introduce a soft magnetic core material to an air-core machine is to replace the fiberglass substrate supporting the electrically conductive traces (e.g., the dielectric core layer of a conventional a CCL sheet) with a soft magnetic material. This material may be non-conductive and relatively stiff, e.g., a ceramic insulator, such as a soft ferrite. Since the material would be exposed to time-varying magnetic fields in the course of operation of the machine, low-loss magnetic characteristics would be desirable. To produce a circuit board structure with a ceramic insulator or the like as the supporting substrate, a planar conductive layer (e.g., a copper layer) may be disposed on either or both surfaces of a planar sheet of the ceramic insulator material to generate a structure similar to a CCL sheet, and such conductive sheet(s) may then be etched, e.g., using standard printed circuit board (PCB) processes, to form patterns for the windings of the poles of an armature and/or other conductive traces.

The properties of the families of materials that meet these criteria, such as difficulty in machining, may mitigate towards implementations that reduce the number of layers needed to form a planar winding structure. The winding structures disclosed in the '953 patent, incorporated by reference above, can be achieved in as few as two conductive layers. There may also be advantages to using a soft magnetic material as a substrate to support the windings of a planar stator in terms of the allowable thermal conditions.

Another possible way to introduce a soft magnetic core material to an air-core machine is to integrate magnetic core material with a printed circuit board as part of the manufacturing process. Such an implementation has the advantage of retaining the techniques and winding procedures of planar stators designed for the printed circuit board processes, as well the inherent precision and scalability associated with such processes. In some such implementations, one or more powdered soft magnetic materials may be combined with one or more carrier materials that are otherwise used as "fill" in the printed circuit board (e.g., a low-viscosity epoxy product) to form a magnetic composite material. Such a magnetic composite material may thus form a soft magnetic core, resulting in a planar armature with a dielectric substrate that supports conductive traces and also has integral soft magnetic material in (at least) the locations where it is needed.

Figure 6:
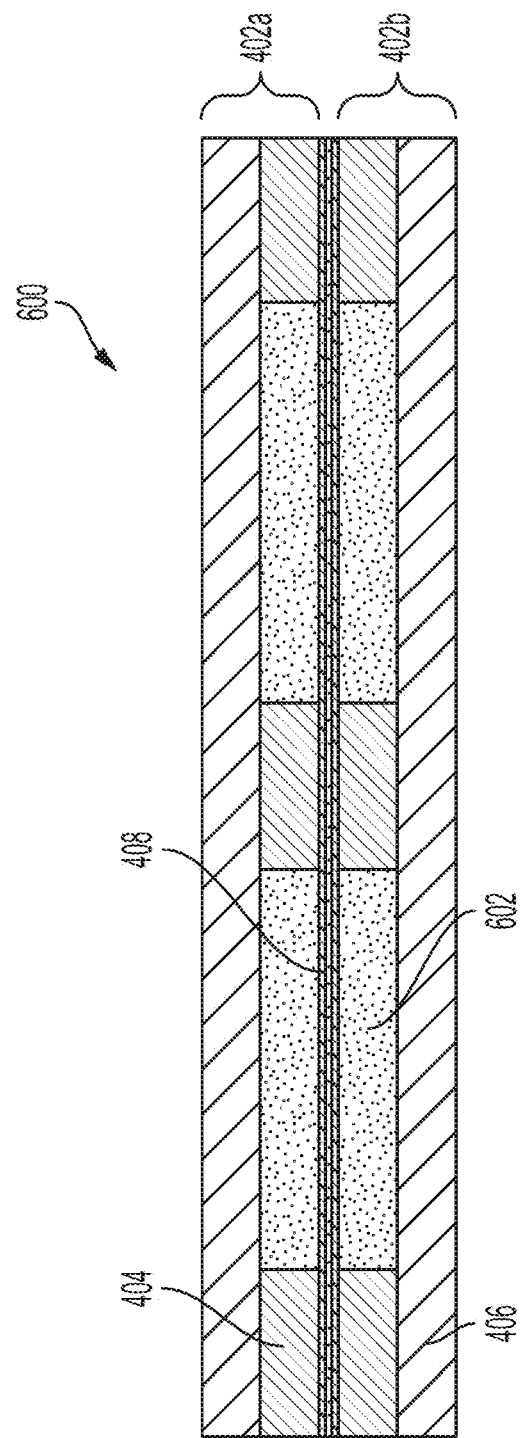
FIG. 6 shows a composite structure (e.g., for use in a planar stator) in which a magnetic composite material is disposed in the interstices between copper features.
Figure 7:
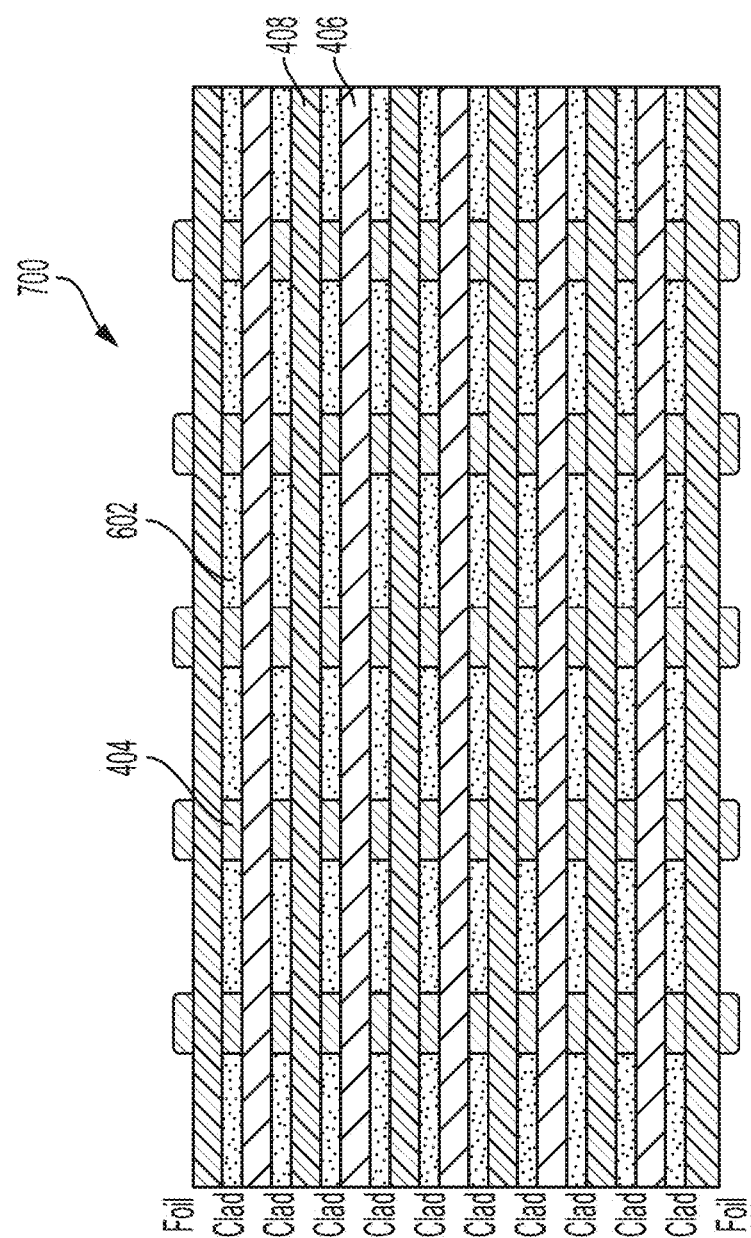
FIG. 7 illustrates how the composite structure of FIG. 6 may be implemented as a repeat unit to construct a practical composite printed circuit board in accordance with some embodiments of the present disclosure.

FIG. 6 shows an example composite structure 600 (e.g., for use in a planar stator 102) in which a dielectric substrate (including the dielectric core layers 406, the magnetic composite material 602, and the prepreg 408) supports conductive traces (i.e., the copper features 404), and in which the magnetic composite material 602 is disposed in the interstices between the copper features 404 (e.g., corresponding to the radial traces 302 shown in FIG. 3). The composite structure 600 can be compared to the composite structure 400 shown in FIG. 4 in which the prepreg 408 and associated epoxy 410 is instead disposed in the interstices between the copper features 404. Since, in the composite structure 600, these interstices are filled with the magnetic composite material 602, the need for prepreg 408 to fill those spaces may be reduced. As such, in some implementations, prepreg 408 may be used only to meet the dielectric requirement of the planar stator 102, i.e., electrical insulation between axially close copper features 404. In some implementations, for instance, only a single layer of prepreg 408 may be disposed between the two layers 402a, 402b of etched copper-clad material. FIG. 7 shows a schematic view of how several of copies of the composite structure 600 shown in FIG. 6 may be included in the stack-up of a novel composite printed board structure 700 with, in this example, twelve layers of conductive materials, e.g., including copper features 404, and integral soft magnetic material, e.g., the magnetic composite material 602 that is positioned in the interstices between the copper features 404.

As noted above, FIG. 3 shows a top view of a typical a planar stator 102 including traces forming stator windings. The active area of the planar stator 102, which is where the rotor axial flux is imposed, is described by an annulus between radii $r_1$ and $r_2$. As shown, the active area of the planar stator 102 may include the radial traces 302. In some implementations, the magnetic composite material 602 described herein may be placed only within this active area, e.g., in the interstices between the radial traces 302. In other implementations, the magnetic composite material 602 may additionally or alternatively be placed in other regions of the planar stator 102.

Powdered soft magnetic materials are widely available for the manufacture of components, such as chokes, inductors, and transformers. Examples of products formed using such powdered soft magnetic materials include Kool Mu (sendust), MPP (molypermalloy), Kool Mµ MAX, Kool Mu_Hf, Edge, High Flux, XFlux, and 75-Series, all available from Magnetics, which has headquarters in Pittsburgh, Pa. In these conventional applications, the powders are often sintered or bonded to form cores, either with embedded wires or as forms around which wires can be wound. Powdered soft magnetic materials of this type are available from a number of sources. Examples include 40337 Iron powder, 00170 Iron powder, and 10214 Iron powder, available from Alfa Aesar (part of Thermo Fisher Scientific) of Tewksbury, Mass.

Eddy current losses in components that include such powdered soft magnetic materials can be controlled via particle size because the interfaces between conductive grains can be made sparse, i.e., so that the particles tend not to form larger conductive networks. Magnetic losses decrease with particle size as well, relative to a bulk sample of the same material, as the collection of grains approximates individual domains with fewer domain-to-domain interactions. As the material particle size becomes extraordinarily small (nano-scale, e.g., between 1 and 100 nanometers), new effects may be apparent. These effects are generally beneficial from the magnetic point of view, but may present challenges from the point of view of handling, mixing, and reactivity with materials for integration in the printed circuit board environment.

In some implementations, to introduce powdered soft magnetic materials, such as those identified above, into printed circuit board stators, a procedure may be used in which one or more such soft magnetic powders are mixed with one or more low-viscosity epoxy products compatible with printed circuit board materials and processes to form a magnetic composite material 602, as described above. In some implementations, soft magnet powder(s) having an optimal magnetic particle size for a given application may be selected and/or such soft magnetic powder(s) may be screened to control the size of the magnetic particles that are used. In some implementations, for example, magnetic powder(s) having an average magnetic particle size (e.g., diameter) of 1 micrometer (µm), or 2 µm, or 5 µm, or 10 µm, or 20 µm, or 50 µm, or 100 µm may be employed. Further in some implementations, such magnetic powder(s) may additionally or alternatively be screened such that the maximum size (e.g., diameter) of the magnetic particles they contain is less than 100 µm, or less than 50 µm, or less than 20 µm, or less than 10 µm, or less than 5 µm, or less than 2 µm, or less than 1 µm. As noted above, eddy current losses in these materials can be managed by controlling the size of the soft magnetic particles so as to cause the interfaces between individual particles to become sufficiently sparse. Further, by keeping the magnetic particles sufficiently small and/or sparse, the magnetic composite material 602 can be made non-conductive in the bulk, even though individual magnetic particles might themselves be conductive in some implementations. The magnetic composite material 602 may thus serve as an insulator between individual conductive traces 302, 404 of a planar stator 102.

An example of a low-viscosity epoxy product that may be mixed with such magnetic powder(s) to form a magnetic composite material 602 is the EMP110 Photoimageable Soldermask available from Electa Polymers Ltd. of Kent, England. Such a magnetic composite material 602 may then be dispensed with standard processes into volumes in the printed circuit board (e.g., in in the interstices between copper features 404) that would otherwise be filled with other materials (e.g., layers of prepreg 408 and/or epoxy 410) in the process of manufacture. The result of this approach is a composite printed circuit board structure, e.g., the composite printed board structure 700 shown in FIG. 7, that incorporates low-loss magnetic material, e.g., the magnetic composite material 602.

In some implementations, to make a planar composite stator integrating one or more powdered soft magnetic materials in the interstices between traces, e.g., the radial traces 302 shown in FIG. 3, there are two principle steps that may be employed in the processing of one of the copper clad repeat units, e.g., one of the layers 402 shown in FIG. 6, of the assembly. A first such step may be to place the soft magnetic material, e.g., the magnetic composite material 602, in the desired locations, and to place a non-magnetic filler material in the locations where magnetic material is not wanted. An example of non-magnetic filler materials suitable for this purpose is the EMP110 Photoimageable Soldermask noted above. In the construction of a planar armature, it may be desirable to confine the soft magnetic material, e.g., the magnetic composite material 602, to the active area of the stator (between r1 and r2 in FIG. 3) in which the interaction with the rotor is significant. A second such step may be to planarize the layers 402 so they may be "stacked" with uniform results. Permutations of the techniques described for these steps may have similar results.

In some embodiments, individual CCL sheets, e.g., FR-4 CCL panels, may be etched with the desired winding pattern, as would be done for a conventional planar stator, e.g., a planar stator of the type described in the '625 and '953 patents incorporated by reference above. A mixture of one or more epoxies and one or more powdered soft magnetic materials, e.g., the magnetic composite material 602 described above, may then be screened or placed via a computer controlled dispenser onto the active areas of the etched CCL sheets, e.g., between the copper features 404 forming the radial traces 302 of the planar stator 102 shown in FIG. 3. In some implementations, the magnetic composite material 602 may be excluded from the areas in which it is not desired, e.g., outside the active area of the planar stator 102, by depositing and partially curing a non-magnetic filler material in these areas prior to depositing the magnetic composite material 602 on the etched CCL sheets. The uncured material may then be mechanically leveled, for example, with a doctor blade. As a result of these processes, some material may lie on the copper traces and may extend beyond the level of the trace tops.

In other embodiments, individual CCL sheets, e.g., FR-4 CCL panels, may first be etched with an initial pattern so as to leave voids at desired locations for subsequently introduced magnetic material. A mixture of one or more epoxies and one or more powdered soft magnetic materials, e.g., the magnetic composite material 602 described above, may then be screened, computer dispensed, or dispensed in bulk onto the initially etched CCL sheets and leveled, for example, with a doctor blade. As a result of these processes, some material may lie on the portions of the copper of the CCL sheets that will form the traces for the planar stator 102. A subsequent etch of the remaining pattern may produce the interstices and voids required for the stator circuit traces that are not desired to be filled with magnetic material. Such voids may then be filled with a non-magnetic filler material, e.g., of the type described above. The sequence of these etch and fill steps may be interchanged in some implementations.

Following the steps above, excess non-magnetic fill material may need to be removed to allow the assembly of a uniform sequence of layers 402. Since the copper traces for the planar stator 102 may be described accurately by the Gerber code used to prepare CCL sheets with a pattern of traces, in some implementations, the same code may be translated to a control sequence for a laser that can oblate the magnetic composite material 602 and level the surface. An appropriate laser for this process may be effective at removing epoxy materials, e.g., the magnetic composite material 602 or the non-magnetic fill material described above, but may be stopped by the underlying copper trace. Such lasers are employed in standard PCB manufacturing to make connections to inner layers in printed circuit boards. In other implementations, the magnetic composite material 602 and/or the non-magnetic fill material may instead be brought to a state of cure where it is possible to economically and effectively planarize the layer mechanically to remove excess material.

The techniques disclosed herein can also be applied to make planar printed circuit board armatures that are thinner as compared to equivalent stators made using conventional techniques. This result may be achieved, for example, by filling the interstitial gaps with epoxy, rather than epoxy loaded with magnetic material. Similar steps to level the surface and remove excess material may be used in such implementations. A reduced number of layers of pre-impregnated cloth, e.g., the prepreg 408 described above, can then be used in the stack up.

Features and Benefits of Integrating Soft Magnetic Core Materials

The integration of core material in an electric machine has a number of benefits, some of which have been previous noted. In particular, the construction here can be automated in construction of the PCB, in contrast to methods that require placing discrete magnetic cores in slots and/or holes in the PCB. The magnetic material may be effectively secured in the PCB matrix.

In a motor application, the presence of core material may allow substitution of lesser grade magnets and/or the use of less magnetic material relative to a similar air-core design. Tradeoffs in quality of motion, harmonics and other motor parameters may also be involved. The presence of core material may allow more effective use of armature reaction, for example, in field weakening applications.

A down side of the technique is that, unlike an air core machine, there is a magnetic force of attraction between the stator and rotor under quiescent conditions. In the center of the gap, the magnetic material filled stator may be at an unstable equilibrium point. This may require, for example, stator geometries that are inherently stiffer relative to air-core designs.

There are numerous market opportunities for motors and generators that work well with inexpensive magnets or where very high torque density is needed.

The benefits of the incorporation of magnetic material described here may apply to other kinds of electromagnetic devices and circuit elements. For example, inductors, transformers, inductive sensors, and energy harvesting devices with PCB traces windings may benefit from embedded core materials.

The technique of filling the interstitial gaps with soft magnetic material may also be employed to make a printed circuit boards (including planar armatures) with high-profile copper features with reduced over-all thickness. This has been reduced to practice. In a typical sample, a stator with conventional stack-up and construction with a thickness of 0.0920 inches was remade using this process, resulting in a thickness of 0.0695 inches. Reduced stator thickness may convey a variety of closely linked machine performance tradeoffs and benefits, including reduced magnet usage, higher efficiency, increased performance, reduction in losses, and/or enhanced thermal performance.

Figure 8:
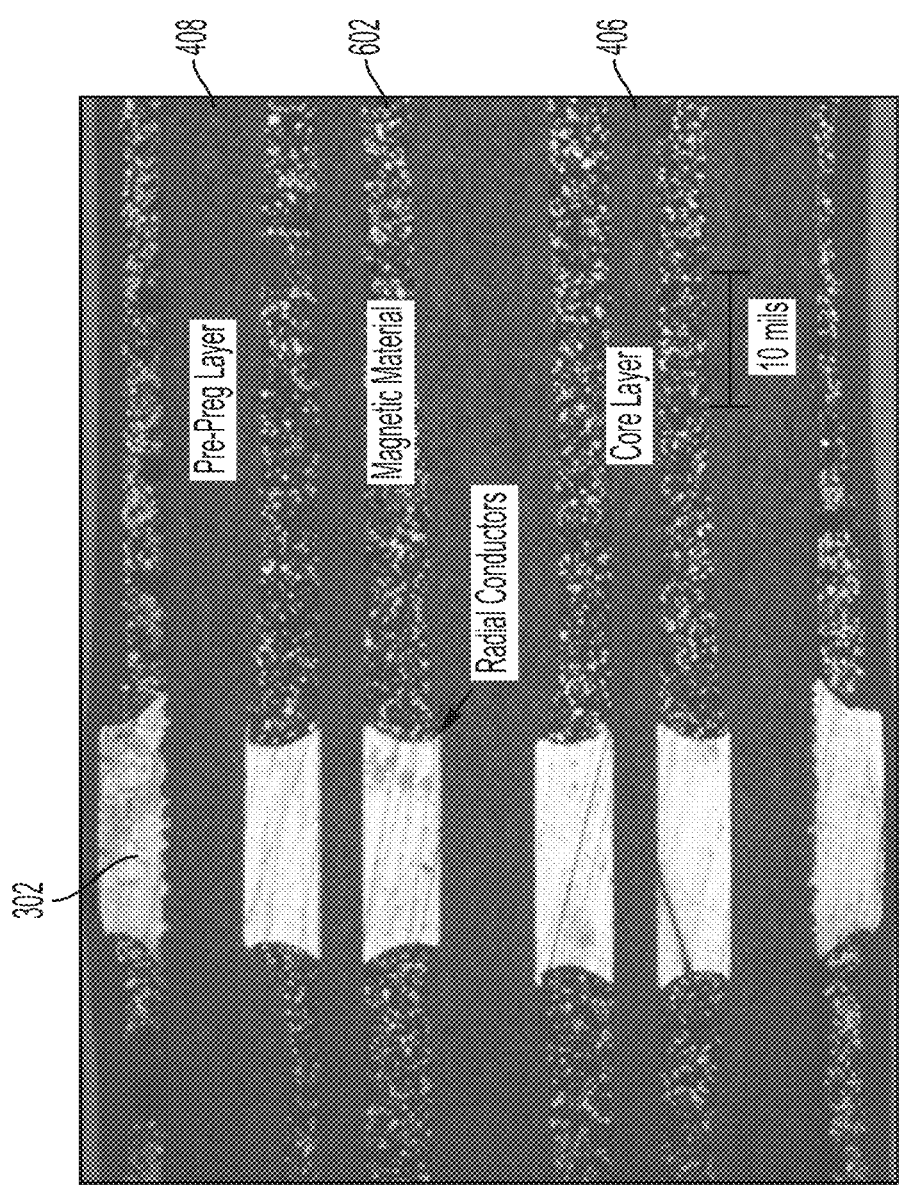
FIG. 8 is a cross section view of a sample from a planar stator, with six conductive layers, showing the deposition of a magnetic composite material in the interstices between radial traces.

FIG. 8 is a cross section view of a sample from a planar stator, with six conductive layers, showing the deposition of a magnetic composite material 602. The magnetic composite material 602 used to fill the interstices between radial traces 302 was formed using a powdered soft magnetic material that was screened to a maximum size of 25 $\mu$m and then mixed with a low-viscosity epoxy product, as described above. The areas including magnetic particles and the epoxy matrix in which such particles are secured are evident. In this prototype, the thickness of the prepreg 408 was not reduced to the extent possible. If this had been done, it would have substantially increased the relative content of magnetic composite material 602 between the radial traces 302.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

Various aspects of the present disclosure may be used alone, in combination, or in a variety of arrangements not specifically discussed in the embodiments described in the foregoing and is therefore not limited in this application to the details and arrangement of components set forth in the foregoing description or illustrated in the drawings. For example, aspects described in one embodiment may be combined in any manner with aspects described in other embodiments.

Also, the disclosed aspects may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc. in the claims to modify a claim element does not by itself connote any priority, precedence or order of one claim element over another or the temporal order in which acts of a method are performed, but are used merely as labels to distinguish one claimed element having a certain name from another element having a same name (but for use of the ordinal term) to distinguish the claim elements.

Also, the phraseology and terminology used herein is used for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A planar armature for an axial flux machine, the planar armature comprising:
   a first layer comprising a first dielectric substrate;
   a second layer comprising a second dielectric substrate; and
   a third layer disposed between the first layer and the second layer, wherein the third layer comprises:
   first conductive traces that form at least first portions of windings for at least a first pole of the planar armature,
   a first quantity of a magnetic composite material disposed in interstices between the first conductive traces within at least a first region of the third layer, wherein the magnetic composite material comprises particles of a soft magnetic material embedded within a first dielectric material and the first region is located within an active area of the axial flux machine, and
   a second quantity of a second dielectric material disposed within at least a second region of the third layer, wherein the second dielectric material is free of the soft magnetic material and the second region is located outside of the active area.

2. The planar armature of claim 1, wherein the soft magnetic material comprises a powdered soft magnetic material.

3. The planar armature of claim 2, wherein the first dielectric material comprises an epoxy.

4. The planar armature of claim 1, wherein a maximum diameter of the particles is 50 micrometers or less.

5. The planar armature of claim 1, wherein at least a portion of the magnetic composite material is disposed within etched regions of a copper clad laminate sheet.

6. The planar armature of claim 1, wherein:
   the first conductive traces comprise radial conductive traces within the active area, and
   the magnetic composite material is disposed in interstices between the radial conductive traces.

7. The planar armature of claim 3, wherein the second dielectric material comprises an epoxy.

8. The planar armature of claim 1, wherein the second dielectric material comprises an epoxy.

9. The planar armature of claim 1, wherein:
   the first dielectric substrate and the first conductive traces are components of a first etched copper clad laminate sheet;
   the second dielectric substrate is a component of a second etched copper clad laminate sheet, wherein the second etched copper clad laminate sheet includes second conductive traces that form at least second portions of the windings for the first pole of the planar armature; and
   the second conductive traces are disposed on a fourth layer of the planar armature, the fourth layer being disposed between the second layer and the third layer.

10. The planar armature of claim 9, further comprising:
    a fifth layer comprising prepreg, the fifth layer being disposed between the third layer and the fourth layer.

11. The planar armature of claim 10, further comprising:
    a third quantity of the magnetic composite material disposed in interstices between the second conductive traces within at least a third region of the fourth layer, wherein the third region is located within the active area of the axial flux machine, and
    a fourth quantity of the second dielectric material disposed within at least a fourth region of the fourth layer, wherein the fourth region is located outside of the active area.

12. The planar armature of claim 11, wherein:
    the first conductive traces are disposed on a first side of the first etched copper clad laminate sheet; and
    third conductive traces are disposed on a second side of the first etched copper clad laminate sheet opposite the first side, wherein the third conductive traces are disposed in a sixth layer of the planar armature and form at least third portions of the windings for the first pole of the planar armature.

13. The planar armature of claim 12, further comprising:
    a fifth quantity of the magnetic composite material disposed in interstices between the third conductive traces within at least a fifth region of the sixth layer, wherein the fifth region is located within the active area of the axial flux machine, and
    a sixth quantity of the second dielectric material disposed within at least a sixth region of the sixth layer, wherein the sixth region is located outside of the active area.

14. The planar armature of claim 9, further comprising:
    a third quantity of the magnetic composite material disposed in interstices between the second conductive traces within at least a third region of the fourth layer, wherein the third region is located within the active area of the axial flux machine, and
    a fourth quantity of the second dielectric material disposed within at least a fourth region of the fourth layer, wherein the fourth region is located outside of the active area.

15. The planar armature of claim 1, wherein:
the first dielectric substrate and the first conductive traces are components of a first etched copper clad laminate sheet; and
the second dielectric substrate comprises prepreg.

\* \* \* \* \*